(12) United States Patent
Nakamura

(10) Patent No.: US 7,948,912 B2
(45) Date of Patent: May 24, 2011

(54) SEMICONDUCTOR INTEGRATED CIRCUIT WITH TEST MODE

(75) Inventor: Kohei Nakamura, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 66 days.

(21) Appl. No.: 12/255,300

(22) Filed: Oct. 21, 2008

(65) Prior Publication Data

US 2009/0268626 A1 Oct. 29, 2009

(30) Foreign Application Priority Data

Apr. 25, 2008 (JP) .................. 2008-116331

(51) Int. Cl.
*H04J 3/00* (2006.01)
*G11C 29/00* (2006.01)
(52) U.S. Cl. ........................ 370/252; 365/201
(58) Field of Classification Search .............. 370/252, 370/527–529, 536, 542
See application file for complete search history.

(56) References Cited

U.S. PATENT DOCUMENTS 3,636,524 A * 1/1972 Holland ................. 370/521
2003/0097656 A1 * 5/2003 Tsubouchi ................. 725/38

FOREIGN PATENT DOCUMENTS

JP 11-306796 A 11/1999

* cited by examiner

*Primary Examiner* — Jason E Mattis
*Assistant Examiner* — Stephen J Clawson
(74) *Attorney, Agent, or Firm* — Sughrue Mion, PLLC

(57) ABSTRACT

A semiconductor integrated circuit is provided which includes: A signal input terminals which include control input pads, A being an integer greater than or equal to 2; an internal circuit; a clock signal input terminal to which a clock signal is input; and an input signal control block which, in a test mode, separates time-division multiplexed data having a multiplicity of X, the time-division multiplexed data being input from A/X signal input terminals among the A signal input terminals, into individual data in accordance with the clock signal, and outputs the separated individual data to the internal circuit, X being an integer greater than or equal to 2.

17 Claims, 9 Drawing Sheets

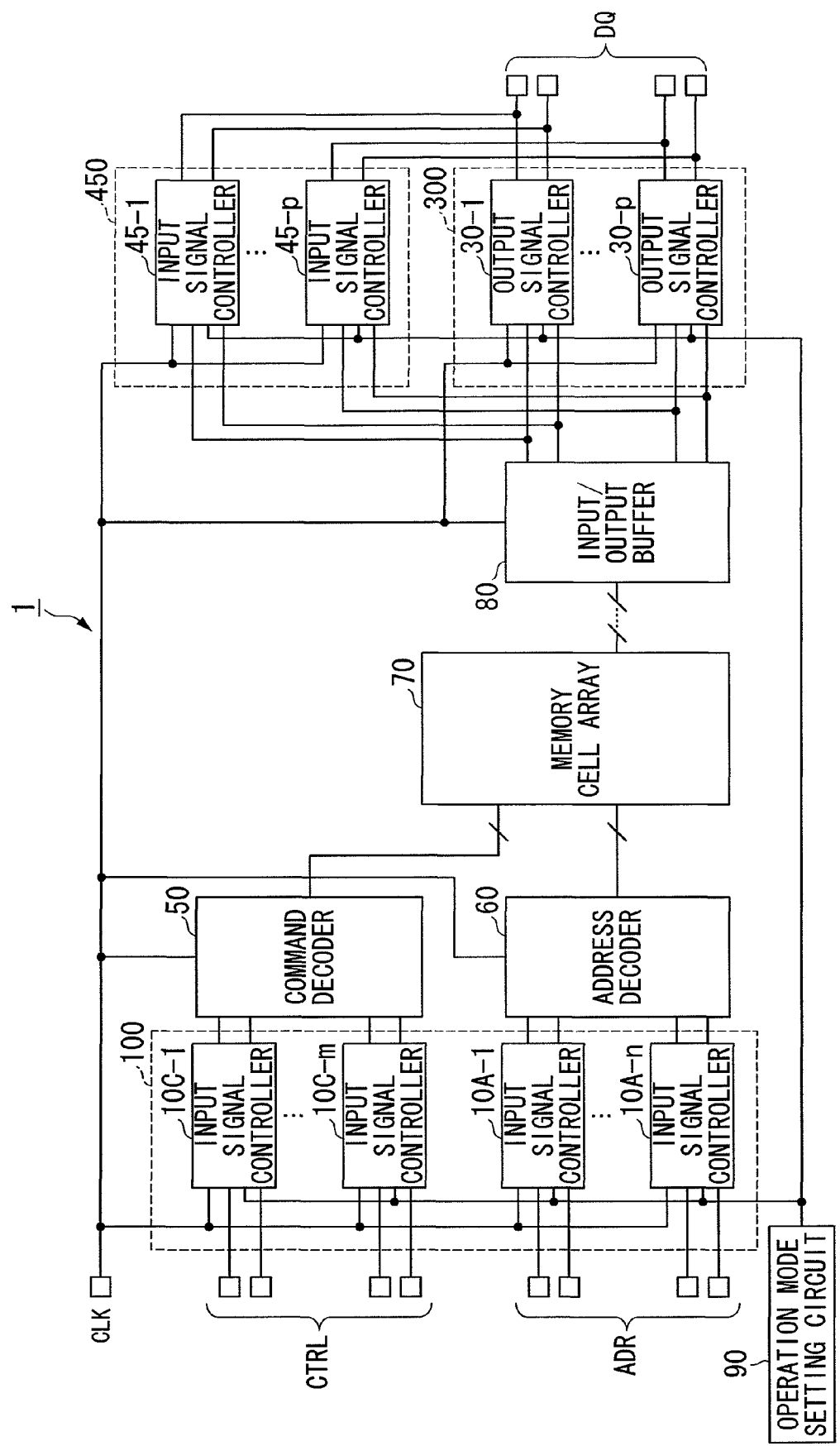

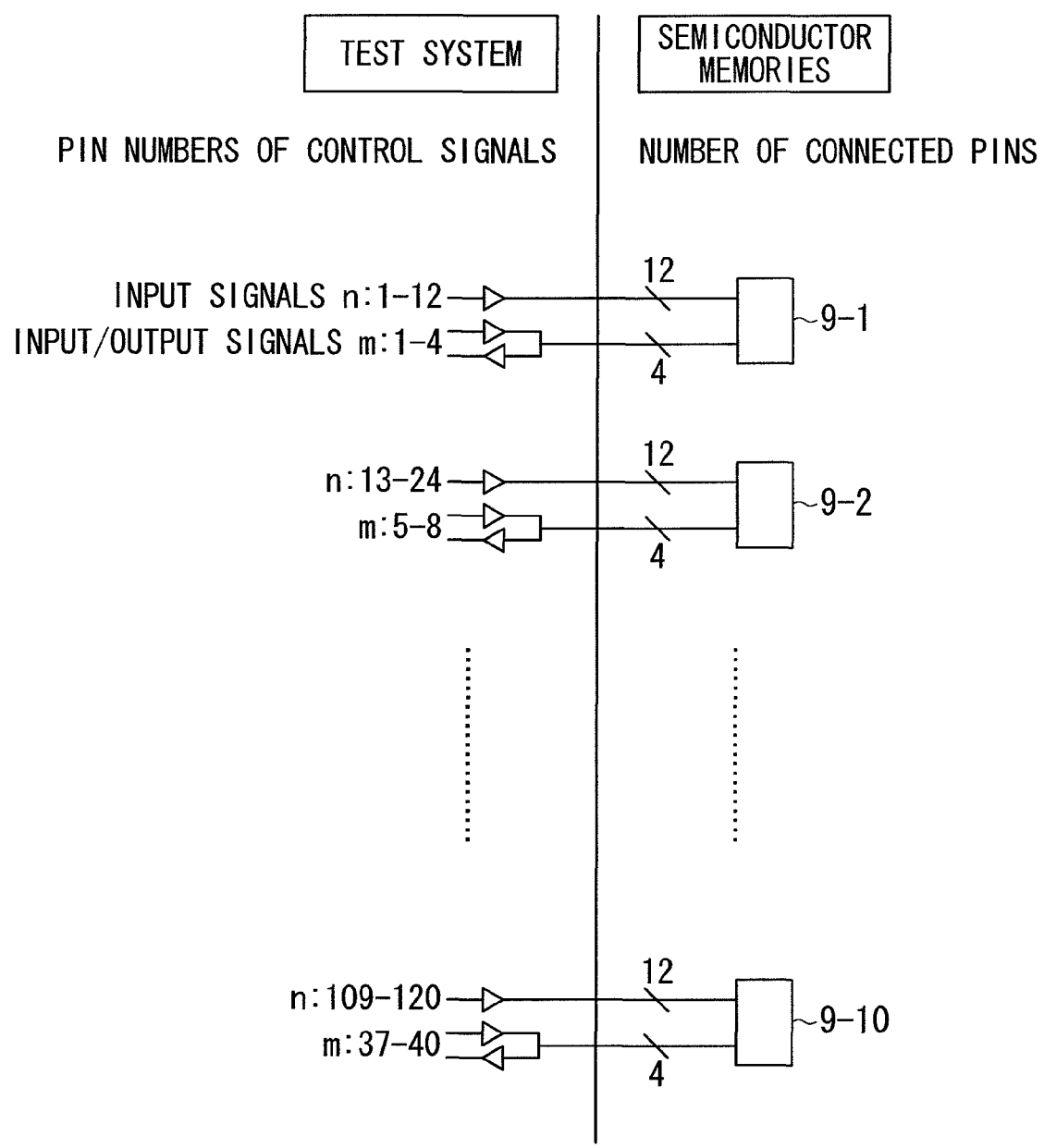

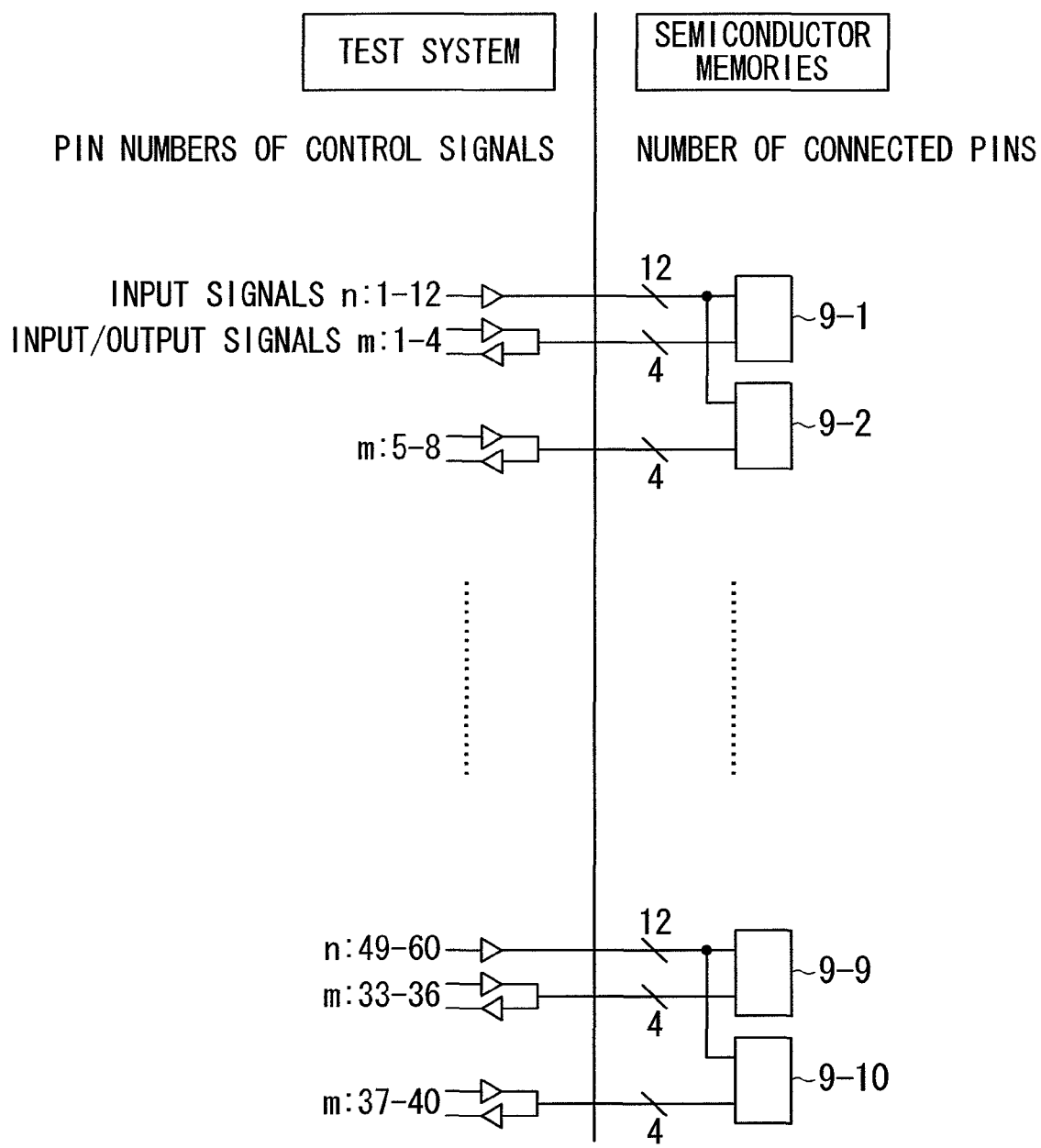

SEMICONDUCTOR INTEGRATED CIRCUIT WITH TEST MODE

BACKGROUND OF THE INVENTION

1. Field of the Invention

The present invention relates to semiconductor integrated circuits such as a DRAM (Dynamic Random Access Memory), and more particularly to a semiconductor integrated circuit which can be set to a test mode for a manufacturing test.

Priority is claimed on Japanese Patent Application No. 2008-116331, filed Apr. 25, 2008, the content of which is incorporated herein by reference.

2. Description of Related Art

In recent years, in the field of manufacturing tests which test functions and operations of semiconductor integrated circuits such as a DRAM, attention has been drawn to the technique in which a plurality of semiconductor chips, which are subjects of manufacturing tests, are connected to a test system or a tester and these semiconductor chips are tested in parallel, to achieve efficiency of the test and shortening the time required for the test.

As an example of such a technique, a method is proposed for reducing the number of input terminals which are used in the manufacturing test of a semiconductor storage apparatus to input an address (Japanese Unexamined Patent Application, First Publication No. H11-306796 (hereinafter referred to as "Patent Document 1")). In accordance with this proposed method, in a normal operation, an address is read once per two periods of a clock ICLK in response to one of two rising edges in the two periods (i.e., in response to every rising edge of a thinned out clock). In contrast, in a manufacturing test, the clock ICLK is not thinned out, and addresses are read in response to every rising edge of the clock. Therefore, in the manufacturing test, addresses are read in accordance with a clock having a rate double the rate of a clock used in the normal operation. As a result, addresses can be input through half the number of address input terminals in accordance with a time-division multiplexing scheme.

However, the present inventor has recognized the following matters.

The method proposed by Patent Document 1 halves the number of address input terminals used in a manufacturing test. However, this proposed method is incapable of inputting signals such as a clock enable signal, a chip select signal, a row address strobe signal, a column address strobe signal, or a write enable signal, which are signals input through control terminals other than the address input terminals, in accordance with the time-division multiplexing scheme.

This is because in order to set a semiconductor storage apparatus, which is the subject of manufacturing tests, to a test mode, it is necessary to set up a mode register provided in the semiconductor storage apparatus by setting the chip select signal, the row address strobe signal, the column address strobe signal, and the write enable signal to a predetermined level (e.g., a low level) and by subsequently inputting a clock signal to the semiconductor storage apparatus.

Therefore, there is a problem in that it is not possible for the method proposed by Patent Document 1 to reduce the number of control terminals used in the manufacturing test.

SUMMARY

The present invention seeks to solve one or more of the above problems, or to improve upon those problems at least in part.

In one embodiment, there is provided a semiconductor integrated circuit which includes: A signal input terminals which include control input pads, A being an integer greater than or equal to 2; an internal circuit; a clock signal input terminal to which a clock signal is input; and an input signal control block which, in a test mode, separates time-division multiplexed data having a multiplicity of X, the time-division multiplexed data being input from A/X signal input terminals among the A signal input terminals into individual data in accordance with the clock signal, and outputs the separated individual data to the internal circuit, X being an integer greater than or equal to 2.

In another embodiment, there is provided a semiconductor integrated circuit which includes: A signal input means including a plurality of control signal input means, A being an integer greater than or equal to 2; a clock signal input means for inputting a clock signal; and a means for, in a test mode, separating time-division multiplexed data having a multiplicity of X, the time-division multiplexed data being input from A/X signal input means among the A signal input means, into individual data in accordance with the clock signal, and outputting the separated individual data to an internal circuit of the semiconductor integrated circuit, X being an integer greater than or equal to 2.

In a further embodiment, there is provided a method which includes: inputting, in a test mode, time-division multiplexed data having a multiplicity of X into a semiconductor integrated circuit through A/X signal input terminals among A signal input terminals which include control input pads, A and X being integers greater than or equal to 2; inputting a clock signal into the semiconductor integrated circuit through a clock signal input terminal; separating the time-division multiplexed data into individual data in accordance with the clock signal; and outputting the separated individual data to an internal circuit of the semiconductor integrated circuit.

In accordance with these embodiments, in a test mode, time-division multiplexed data is input to a signal input terminal, the time-division multiplexed data is separated into individual data, and the separated individual data is output to an internal circuit. As a result, it is possible to input the same data as that of a normal operation mode using only A/X signal input terminals among A signal input terminals. In other words, the number of signal input terminals for inputting control signals which are used when performing a manufacturing test of a semiconductor integrated circuit can be reduced to 1/X. Therefore, it is possible to increase the number of semiconductor integrated circuits that can be connected to a limited number of terminals of a test system and thus to increase the number of semiconductor integrated circuits that are tested simultaneously X times without increasing the number of signal input terminals used in the manufacturing test. As a result, the time required for the manufacturing test can be reduced significantly, and the test costs for the manufacturing test of the semiconductor integrated circuit can also be reduced significantly.

BRIEF DESCRIPTION OF THE DRAWINGS

The above features and advantages of the present invention will be more apparent from the following description of certain preferred embodiments taken in conjunction with the accompanying drawings, in which:

FIG. 5 is a block diagram showing an example of the schematic structure of a semiconductor integrated circuit (a semiconductor memory) in which the input signal controller and the output signal controller in accordance with the first embodiment are employed;

FIG. 6A is a diagram showing the relationship between pins of a test system and those of semiconductor memories in a manufacturing test (measurement) of a semiconductor integrated circuit in accordance with the related art;

FIG. 7A is a diagram showing the relationship between pins of a test system and those of semiconductor memories in a manufacturing test (measurement) of the semiconductor integrated circuit in accordance with the related art.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, an input signal controller, an output signal controller, and a semiconductor integrated circuit, in which the input signal controller and the output signal controller are employed, in accordance with a first embodiment of the present invention will be explained with reference to the drawings.

Figure 1:
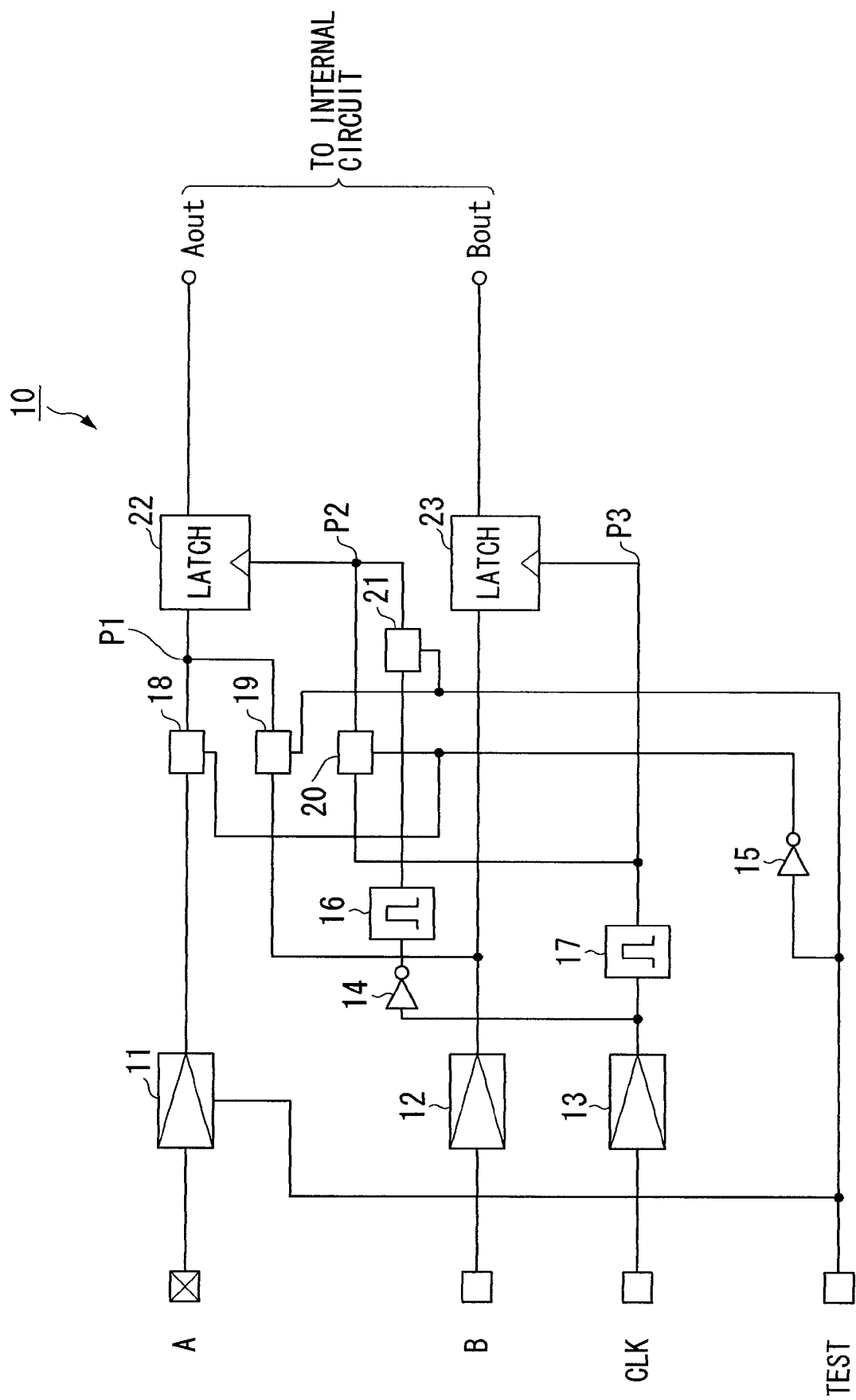
FIG. 1 is a block diagram showing the internal structure of an input signal controller in accordance with a first embodiment of the present invention.

FIG. 1 is a block diagram showing the schematic structure of an input signal controller 10 in accordance with the present embodiment. The input signal controller 10 is provided with: input terminals A and B; a clock input terminal CLK; a test mode input terminal TEST; output terminals Aout and Bout; an input tri-state buffer 11; input buffers 12 and 13; inverters 14 and 15; one-shot pulse generators 16 and 17; transfer gates 18, 19, 20, and 21; and latches 22 and 23.

The input terminal A and the input terminal B are connected to, for example, pads of a semiconductor integrated circuit. The output terminal Aout and the output terminal Bout are connected to an internal circuit of the semiconductor integrated circuit. In other words, signals supplied from the outside of the semiconductor integrated circuit are input to the internal circuit of the semiconductor integrated circuit through the input signal controller 10. A mode signal is input to the test mode input terminal TEST, the mode signal being used for determining whether the input signal controller 10 is operating under a test mode in which a manufacturing test is performed or under a normal operation mode in which a product of the semiconductor integrated circuit is used.

A signal is input from the input terminal A to the input tri-state buffer 11. In addition, the mode signal, which is input from the test mode input terminal TEST, is input to the input tri-state buffer 11 as an enable signal. When the input enable signal is a low level (an "L" level), the input tri-state buffer 11 amplifies the signal input from the input terminal A, and outputs the amplified signal to the transfer gate 18. In contrast, when the input enable signal is a high level (an "H" level), the input tri-state buffer 11 sets its output to a high impedance state.

A signal is input from the input terminal B to the input buffer 12. The input buffer 12 amplifies the input signal, and outputs the amplified signal to the transfer gate 19 and the latch 23.

A clock signal is input from the clock input terminal CLK to the input buffer 13. The input buffer 13 amplifies the input clock signal, and outputs the amplified signal to the inverter 14 and the one-shot pulse generator 17.

The inverter 14 inverts the clock signal input from the input buffer 13, and outputs an inverted clock signal to the one-shot pulse generator 16.

The inverter 15 inverts the mode signal input from the test mode input terminal TEST, and outputs an inverted mode signal to the transfer gate 18 and the transfer gate 20 as enable signals.

In response to a rising edge of the signal input from the inverter 14, the one-shot pulse generator 16 outputs a one-shot pulse to the transfer gate 21 as a timing signal. The level of this one-shot pulse changes from a low level to a high level and then changes from the high level to a low level.

In response to a rising edge of the signal input from the input buffer 13, the one-shot pulse generator 17 outputs a one-shot pulse to the transfer gate 20 and a clock input of the latch 23 as timing signals. The level of this one-shot pulse changes from a low level to a high level and then changes from the high level to a low level.

Upon receipt of a high-level signal from the inverter 15 (i.e., when a low-level mode signal is input to the test mode input terminal TEST), the transfer gate 18 outputs the signal input from the input tri-state buffer 11 to the latch 22. In contrast, upon receipt of a low-level signal from the inverter 15 (i.e., when a high-level mode signal is input to the test mode input terminal TEST), the transfer gate 18 sets its output to a high impedance state.

Upon receipt of a high-level mode signal from the test mode input terminal TEST, the transfer gate 19 outputs the signal input from the input terminal B through the input buffer 12 to the latch 22. In contrast, upon receipt of a low-level mode signal from the test mode input terminal TEST, the transfer gate 19 sets its output to a high impedance state.

Upon receipt of a high-level signal from the inverter 15, the transfer gate 20 outputs the signal input from the one-shot pulse generator 17 to a clock input of the latch 22. In contrast, upon receipt of a low-level signal from the inverter 15, the transfer gate 20 sets its output to a high impedance state.

Upon receipt of a high-level mode signal from the test mode input terminal TEST, the transfer gate 21 outputs the signal input from the one-shot pulse generator 16 to the clock input of the latch 22. In contrast, upon receipt of a low-level mode signal from the test mode input terminal TEST, the transfer gate 21 sets its output to a high impedance state.

In response to the timing signal input from the transfer gate 20 or from the transfer gate 21, the latch 22 stores a signal input from the transfer gate 18 or a signal input from the transfer gate 19, and outputs the stored signal to the output terminal Aout.

In response to the timing signal input from the one-shot pulse generator 17, the latch 23 stores a signal input from the input buffer 12, and outputs the stored signal to the output terminal Bout.

It is noted that the input buffers 12 and 13 may be omitted.

As described above, the input signal controller 10 switches data signals and clock signals which are supplied to the latch 22 in accordance with the mode signal input from the test mode input terminal TEST. It is noted that the test mode is a mode when a high-level mode signal is input to the test mode input terminal TEST, while the normal operation mode is a mode when a low-level mode signal is input to the test mode input terminal TEST.

Figure 2:
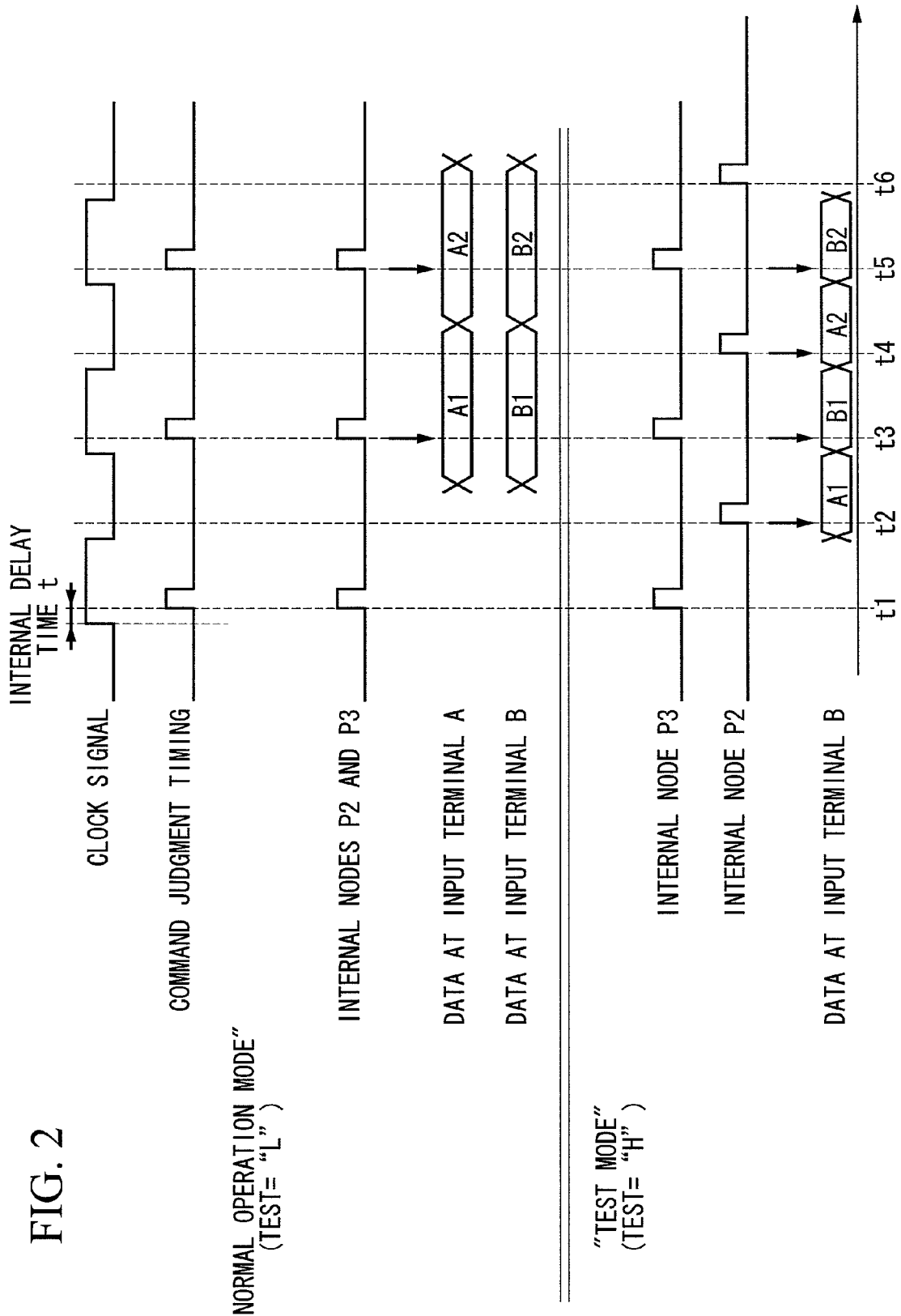
FIG. 2 is a timing chart showing the operation of the input signal controller in accordance with the first embodiment in a normal operation mode and the operation of this input signal controller in a test mode.

FIG. 2 is a timing chart to explain the operation of the input signal controller 10 in accordance with the present embodiment. More specifically, FIG. 2 illustrates a comparison between the operation in the test mode in which a manufacturing test is performed and the operation in the normal operation mode in which a product is used. In this timing chart, the horizontal axis denotes time and the vertical axis denotes levels of signals and values of data.

Moreover, as illustrated in FIG. 2, a delay having an internal delay time t is generated between the clock signal input from the clock input terminal CLK and the timing signals observed at internal nodes P1, P2, and P3 as a result of delays caused by components such as the input tri-state buffer 11, the input buffers 12 and 13, the inverters 14 and 15, the one-shot pulse generators 16 and 17, or the transfer gates 20 and 21.

The latches 22 and 23 store input data (i.e., an address signal or a command signal) in synchronization with a rising edge of the clock signal or a falling edge of the clock signal. The command judgment timing (i.e., the timing when the kind of a command supplied from the outside of the semiconductor integrated circuit is determined) in a test operation is the same as that of normal operation.

First, the operation of the input signal controller 10 in normal operation mode will be explained. A low-level mode signal is input to the test mode input terminal TEST. As a result, signals output from the transfer gates 18 to 21 are changed. Specifically, the signal from the input terminal A is input to the latch 22 through the input tri-state buffer 11 and the transfer gate 18. Moreover, the timing signal output from the one-shot pulse generator 17 is input to the latch 22 through the transfer gate 20.

Similar to the latch 22, the timing signal from the one-shot pulse generator 17 is input to the latch 23.

In response to a rising edge of the clock signal input through the clock input terminal CLK and the input buffer 13, the one-shot pulse generator 17 outputs a timing signal to the transfer gate 20 and the latch 23.

In cycle t2, data "A1" input from the input terminal A is input to the latch 22 through the input tri-state buffer 11 and the transfer gate 18. Moreover, data "B1" input from the input terminal B is input to the latch 23 through the input buffer 12.

In cycle t3, in response to a rising edge of the clock signal input from the clock input terminal CLK through the input buffer 13, the one-shot pulse generator 17 outputs a timing signal. In response to the timing signal input from the one-shot pulse generator 17 through the transfer gate 20 and the internal node P2, the latch 22 stores the input data "A1". Moreover, the latch 22 outputs the stored data "A1" to the output terminal Aout. In response to the timing signal input from the one-shot pulse generator 17 through the internal node P3, the latch 23 stores the input data "B1". Moreover, the latch 23 outputs the stored data "B1" to the output terminal Bout.

In cycle t4, data "A2" input from the input terminal A is input to the latch 22 through the input tri-state buffer 11 and the transfer gate 18. Moreover, data "B2" input from the input terminal B is input to the latch 23 through the input buffer 12.

In cycle t5, in response to a rising edge of the clock signal input from the clock input terminal CLK through the input buffer 13, the one-shot pulse generator 17 outputs a timing signal. In response to the timing signal input from the one-shot pulse generator 17 through the transfer gate 20 and the internal node P2, the latch 22 stores the input data "A2". Moreover, the latch 22 outputs the stored data "A2" to the output terminal Aout. In response to the timing signal input from the one-shot pulse generator 17 through the internal node P3, the latch 23 stores the input data "B2". Moreover, the latch 23 outputs the stored data "B2" to the output terminal Bout.

In this way, in the normal operation mode, the input signal controller 10 stores the signals input from the two (X when each clock cycle is divided into X sections) input terminals A and B in synchronization with the clock signal input from the clock input terminal CLK, and outputs the stored signals to the internal circuit through the output terminal Aout and the output terminal Bout.

Next, the operation of the input signal controller 10 in the test mode will be explained.

First, a high-level mode signal is input to the test mode input terminal TEST. As a result, signals output from the transfer gates 18 to 21 are changed. Specifically, the signal input from the input terminal B is input to the latch 22 through the input buffer 12 and the transfer gate 19. Moreover, the timing signal output from the one-shot pulse generator 16 is input to the latch 22 through the transfer gate 21. A high-level mode signal is input from the test mode input terminal TEST to the input tri-state buffer 11 as an enable signal, and hence the output of the input tri-state buffer 11 becomes a high impedance state.

In the same manner as in the normal operation mode, the signal input from the input terminal B is input to the latch 23 through the input buffer 12. Moreover, the timing signal from the one-shot pulse generator 17 is input to the clock input of the latch 23.

In response to a rising edge of the inverted clock signal input through the clock input terminal CLK, the input buffer 13, and the inverter 14, the one-shot pulse generator 16 outputs a timing signal to the transfer gate 21. In the same manner as in the normal operation mode, in response to a rising edge of the clock signal input through the clock input terminal CLK and the input buffer 13, the one-shot pulse generator 17 outputs a timing signal to the latch 23 and the transfer gate 20.

The timing signal output from the one-shot pulse generator 16 is observed at the internal node P2. This timing signal is synchronized with a falling edge of the clock signal. The timing signal output from the one-shot pulse generator 17 is observed at the internal node P3. This timing signal is synchronized with a rising edge of the clock signal.

First, in cycle t 1, data "A1" input from the input terminal B is input to the latch 22 through the input buffer 12 and the transfer gate 19. In addition, the data "A1" input from the input terminal B is input to the latch 23 through the input buffer 12.

In cycle t2, in response to a rising edge of the inverted clock signal input from the inverter 14, the one-shot pulse generator 16 outputs a timing signal to the latch 22 through the transfer gate 21 and the internal node P2. Upon receipt of the timing signal from the one-shot pulse generator 16, the latch 22 stores the input data "A1". Moreover, the latch 22 outputs the stored "A1" to the output terminal Aout.

After the latch 22 has stored the input data "A1", data "B1" is input to the input terminal B. The data "B1" input from the input terminal B is input to the latch 22 20 through the input buffer 12 and the transfer gate 19. In addition, the data "B1" input from the input terminal B is input to the latch 23 through the input buffer 12.

In cycle t3, in response to a rising edge of the clock signal input through the input buffer 13, the one-shot pulse generator 17 outputs a timing signal to the transfer gate 20 and the latch 23. At this time, since the transfer gate 20 is closed, the transfer 25 gate 20 does not output the input timing signal to the latch 22. Upon receipt of the timing signal from the one-shot pulse generator 17, the latch 23 stores the input data "B1", and outputs the stored data "B1" to the output terminal Bout.

After the latch 23 has stored the input data "B1", data "A2" is input to the input terminal B. The data "A2" input from the input terminal B is input to the latch 22 through the input buffer 12 and the transfer gate 19. In addition, the data "A2" input from the input terminal B is input to the latch 23 through the input buffer 12.

In cycle t4, in response to a rising edge of the inverted clock signal input from the inverter 14, the one-shot pulse generator 16 outputs a timing signal to the latch 22 through the transfer gate 21 and the internal node P2. Upon receipt of the timing signal from the one-shot pulse generator 16, the latch 22 stores the input data "A2", and outputs the stored data "A2" to the output terminal Aout.

After the latch 22 has stored the input data "A2", data "B2" is input to the input terminal B. The data "B2" supplied from the input terminal B is input to the latch 22 through the input buffer 12 and the transfer gate 19. In addition, the data "B2" supplied from the input terminal B is input to the latch 23 through the input buffer 12.

In cycle t5, in response to a rising edge of the clock signal input from the input buffer 13, the one-shot pulse generator 17 outputs a timing signal to the transfer gate 20 and the latch 23. At this time, since the transfer gate 20 is closed, the transfer gate 20 does not output the input timing signal to the latch 22. Upon receipt of the timing signal from the one-shot pulse generator 17, the latch 23 stores the input data "B2", and outputs the stored data "B2" to the output terminal Bout.

In this manner, in the test mode, the input signal controller 10 separates the time-division multiplexed data having a multiplicity of 2 which has been input from the input terminal B into two (X when each clock cycle is divided into X sections) pieces of data in accordance with the clock signal, and outputs the separated individual data to the internal circuit.

As described above, in the normal operation mode, the input signal controller 10 outputs signals input from the input terminal A to the output terminal Aout through the latch 22, and outputs signals input from the input terminal B to the output terminal Bout through the latch 23.

In contrast, in the test mode, the input signal controller 10 divides each clock cycle into two sections by using both the rising edges and the falling edges of the clock signal. The input signal controller 10 drives the latch 22 in response to a falling edge of the clock signal input from the clock input terminal CLK, and drives the latch 23 in response to a rising edge of the clock signal. In this manner, while two input terminals A and B are used in the normal operation mode, in the test mode, the same data as that of the normal operation mode can be input using the single input terminal B by means of the time-division multiplexing of signals input to the input terminal B.

It is noted that the present embodiment has demonstrated an example in which each clock cycle is divided into two sections by using the rising edges and the falling edges of the clock signal. However, each clock cycle may be divided into X sections, where X is greater than or equal to 2, and hence it is possible to reduce the number of input terminals used for inputting data to 1/X.

Employing the input signal controller 10 makes it possible to perform time-division multiplexing by simply controlling input data latches (i.e., the latch 22 and the latch 23). Moreover, signals output to the internal circuit change so as to have the same period as that of the normal operation mode. As a result, command control can be achieved with the same number of clock cycles as that of the related art. Therefore, it is possible to perform a manufacturing test without changing the period of each clock cycle, provided that there is a sufficient operating margin with respect to restrictions on timing between a semiconductor integrated circuit and a test system.

Furthermore, when the input signal controller 10 is employed, the number of signal input terminals connected to a tester which are used for inputting control signals is reduced. Therefore, it is not possible to input data which is necessary to set an MRS (Mode Register Set) command, and hence the mode of the semiconductor integrated circuit cannot be set to the test mode (i.e., entry into the test mode). In view of such circumstances, entry into the test mode is achieved by using, for example, an optional signal input terminal (i.e., an input pad dedicated to the test mode) or control by means of a fuse.

Figure 3:
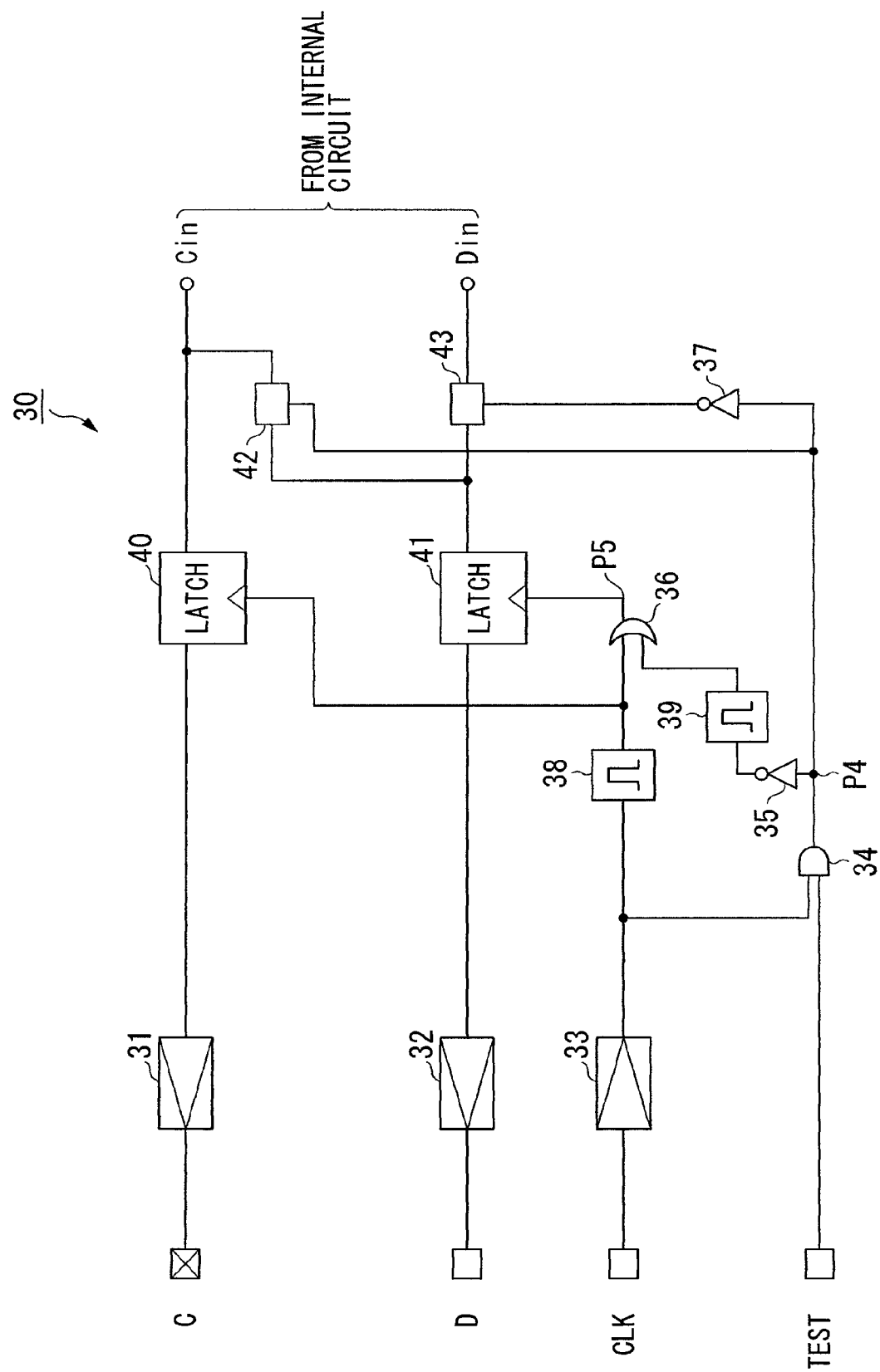
FIG. 3 is a block diagram showing the internal structure of an output signal controller in accordance with the first embodiment.

Next, FIG. 3 is a block diagram showing the schematic structure of an output signal controller 30 in accordance with the present embodiment. The output signal controller 30 is provided with: output terminals C and D; a clock input terminal CLK; a test mode input terminal TEST; input terminals Cin and Din; output buffers 31 and 32; an input buffer 33; an AND gate 34; inverters 35 and 37; an OR gate 36; one-shot pulse generators 38 and 39; latches 40 and 41; and transfer gates 42 and 43.

The output terminal C and the output terminal D are connected to, for example, pads of the semiconductor integrated circuit. The input terminal Cin and the input terminal Din are connected to the internal circuit of the semiconductor integrated circuit. In other words, the internal circuit of the semiconductor integrated circuit outputs signals to the outside of the semiconductor integrated circuit through the output signal controller 30. A signal which is used for determining whether the output signal controller 30 is operating under the test mode or under the normal operation mode is input to the test mode input terminal TEST.

The output buffer 31 amplifies a signal output from the latch 40 and outputs the amplified signal to the output terminal C. The output buffer 32 amplifies a signal output from the latch 41 and outputs the amplified signal to the output terminal D. The input buffer 33 amplifies a clock signal input from the clock input terminal CLK, and outputs the amplified signal to the AND gate 34 and the one-shot pulse generator 38.

A mode signal input from the test mode input terminal TEST and the amplified signal output from the input buffer 33 are input to the AND gate 34. The AND gate 34 calculates a logical product of these two input signals, and outputs the resultant signal to the inverters 35 and 37 as well as the transfer gate 42. The signal output from the AND gate 34 to the transfer gate 42 is a signal used for controlling whether or not the transfer gate 42 outputs a signal. The inverter 35 inverts the signal output from the AND gate 34 and outputs the inverted signal to the one-shot pulse generator 39. The OR gate 36 calculates a logical sum of timing signals output from the one-shot pulse generators 38 and 39, and outputs the resultant signal to the latch 41 as a timing signal. The inverter 37 inverts the signal output from the AND gate 34, and outputs the inverted signal to the transfer gate 43 as a signal used for controlling whether or not the transfer gate 43 outputs a signal.

In response to a rising edge of the clock signal amplified by the input buffer 33, the one-shot pulse generator 38 outputs a one-shot pulse to the latch 40 and the OR gate 36 as timing signals. The level of this one-shot pulse changes from a low level to a high level and then changes from the high level to a low level. In response to a rising edge of the signal output from the inverter 35, the one-shot pulse generator 39 outputs a one-shot pulse to the OR gate 36 as a timing signal. The level of this one-shot pulse changes from a low level to a high level and then changes from the high level to a low level. It is noted that when a high-level mode signal is input from the test mode input terminal TEST and the clock signal input from the clock input terminal CLK falls, a rising edge appears in the signal output from the inverter 35.

Upon receipt of the timing signal from the one-shot pulse generator 38, the latch 40 stores data input from the input terminal Cin, and outputs the stored data to the output buffer 31.

Upon receipt of the timing signal from the OR gate 36, the latch 41 stores data which is input thereto, and outputs the stored data to the output buffer 32. The data input to the latch 41 is data input from either the transfer gate 42 or the transfer gate 43.

Upon receipt of a high-level signal from the AND gate 34, the transfer gate 42 outputs data input from the input terminal Cin to the latch 41. In contrast, upon receipt of a low-level signal from the AND gate 34, the transfer gate 42 sets its output to a high impedance state.

Upon receipt of a high-level signal from the inverter 37, the transfer gate 43 outputs data input from the input terminal Din to the latch 41. In contrast, upon receipt of a low-level signal from the inverter 37, the transfer gate 43 sets its output to a high impedance state.

It is noted that the polarity of the signal output from the AND gate 34 is opposite to that of the signal output from the inverter 37. Thus, data input to the latch 41 is either the data input from the input terminal Cin or the data input from the input terminal Din.

Moreover, the output buffers 31 and 32, and the input buffer 33 may be omitted.

Figure 4:
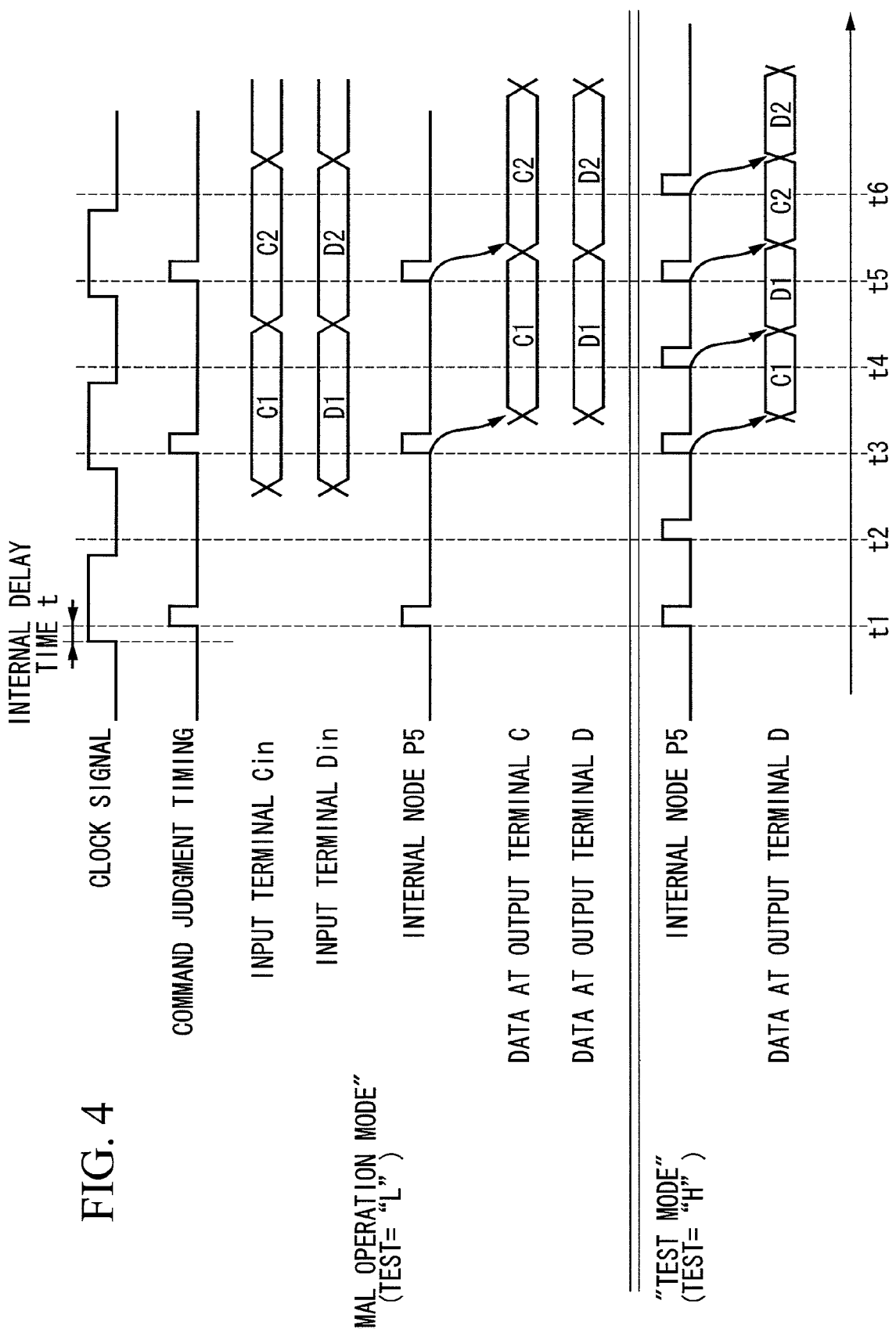
FIG. 4 is a timing chart showing the operation of the output signal controller in accordance with the first embodiment in a normal operation mode and the operation of this output signal controller in a test mode.

Next, FIG. 4 is a timing chart to explain the operation of the output signal controller 30 in accordance with the present embodiment. More specifically, FIG. 4 illustrates a comparison between the operation in the test mode in which a manufacturing test is performed and an operation in the normal operation mode in which a product is used. In this timing chart, the horizontal axis denotes time and the vertical axis denotes levels of signals and values of data.

Moreover, as illustrated in FIG. 4, a delay having an internal delay time t is generated between the clock signal input from the clock input terminal CLK and the timing signal observed at the internal node P5 as a result of delays caused by components such as the input buffer 33, the one-shot pulse generators 38 and 39, the AND gate 34, the inverter 35, or the OR gate 36.

The latches 40 and 41 store data which is input thereto (data signals to be output) in synchronization with a rising edge of the clock signal or a falling edge of the clock signal. Moreover, the command judgment timing in a test operation is the same as that of a normal operation.

First, the operation of the output signal controller 30 in the normal operation mode will be explained. A low-level mode signal is input to the test mode input terminal TEST. As a result, the output of the AND gate 34 becomes a low level irrespective of the clock signal output from the input buffer 33. A low-level signal from the AND gate 34 is input to the transfer gate 42, and the transfer gate 42 sets its output to a high impedance state. A high-level signal from the inverter 37 is input to the transfer gate 43, and the transfer gate 43 outputs data which has been input from the input terminal Din to the latch 41. In the normal operation mode, a high-level signal from the inverter 35 is always input to the one-shot pulse generator 39, so that the one-shot pulse generator 39 does not output a timing signal.

In cycle t2, data "C1" from the input terminal Cin is input to the latch 40. Data "D1" from the input terminal Din is input to the latch 41 through the transfer gate 43.

In cycle t3, in response to a rising edge of the clock signal input from the clock input terminal CLK through the input buffer 33, the one-shot pulse generator 38 outputs a timing signal. Upon receipt of the timing signal from the one-shot pulse generator 38, the latch 40 stores the data "C1" input from the input terminal Cin, and outputs the stored data "C1" to the output buffer 31. The output buffer 31 amplifies the data "C1" input from the latch 40, and outputs the amplified signal to the output terminal C.

Upon receipt of the timing signal from the one-shot pulse generator 38 through OR gate 36, the latch 41 stores the data "D1" input from the input terminal Din, and outputs the stored data "D1" to the output buffer 32. The output buffer 32 amplifies the data "D1" input from the latch 41, and outputs the amplified signal to the output terminal D.

In cycle t4, data "C2" from the input terminal Cin is input to the latch 40. Data "D2" from the input terminal Din is input to the latch 41 through the transfer gate 43.

In cycle t5, in response to a rising edge of the clock signal input from the clock input terminal CLK through the input buffer 33, the one-shot pulse generator 38 outputs a timing signal. Upon receipt of the timing signal from the one-shot pulse generator 38, the latch 40 stores the data "C2" input from the input terminal Cin, and outputs the stored data "C2" to the output buffer 31. The output buffer 31 amplifies the data "C2" input from the latch 40, and outputs the amplified signal to the output terminal C.

Upon receipt of the timing signal from the one-shot pulse generator 38 through the OR gate 36, the latch 41 stores the data "D2" input from the input terminal Din, and outputs the stored data "D2" to the output buffer 32. The output buffer 32 amplifies the data "D2" input from the latch 41, and outputs the amplified signal to the output terminal D.

In this manner, in the normal operation mode, the output signal controller 30 outputs data input from the internal circuit to the two (X when each clock cycle is divided into X sections) output terminals C and D.

Next, the operation of the output signal controller 30 in the test mode will be explained.

A high-level mode signal is input to the test mode input terminal TEST. As a result, the AND gate 34 outputs the clock signal which has been input from the clock input terminal CLK through the input buffer 33 to the inverter 35, the inverter 37, and the transfer gate 42.

The inverter 35 inverts the clock signal input from the AND gate 34, and outputs the inverted clock signal to the one-shot pulse generator 39. The inverter 37 inverts the clock signal input from the AND gate 34, and outputs an inverted clock signal to the transfer gate 43.

The one-shot pulse generator 39 outputs a timing signal in synchronization with a falling edge of the clock signal input from the clock input terminal CLK. When a high-level clock signal is input to the clock input terminal CLK, the transfer gate 42 outputs data input from the input terminal Cin to the latch 41. When a low-level clock signal is input to the clock input terminal CLK, the transfer gate 43 outputs data input from the input terminal Din to the latch 41.

First, in cycle t3, upon receipt of a high-level clock signal from the AND gate 34, the transfer gate 42 outputs data "C1" input from the input terminal Cin to the latch 41. A low-level inverted clock signal from the inverter 37 is input to the transfer gate 43, and the transfer gate 43 sets its output to a high impedance state.

In response to a rising edge of the clock signal, the one-shot pulse generator 38 outputs a timing signal to the latch 41 through the OR gate 36. Upon receipt of the timing signal from the one-shot pulse generator 38, the latch 41 stores the data "C1" input from the transfer gate 42, and outputs the stored data "C1" to the output buffer 32. The output buffer 32 amplifies the data "C1" input from the latch 41, and outputs the amplified signal of the data "C1" to the output terminal D.

In cycle t4, upon receipt of a high-level inverted clock signal from the inverter 37, the transfer gate 43 outputs data "D1" input from the input terminal Din to the latch 41. A low-level clock signal from the AND gate 34 is input to the transfer gate 42, and the transfer gate 42 sets its output to a high impedance state.

In response to a rising edge of the inverted clock signal from the inverter 35, the one-shot pulse generator 39 outputs a timing signal to the latch 41 through the OR gate 36. Upon receipt of the timing signal from the one-shot pulse generator 39, the latch 41 stores the data "D1" input from the transfer gate 43, and outputs the stored data "D1" to the output buffer 32. The output buffer 32 amplifies the input data "D1" and outputs the amplified signal of the data "D1" to the output terminal D.

In cycle t5, upon receipt of a high-level clock signal from the AND gate 34, the transfer gate 42 outputs data "C2" input from the input terminal Cin to the latch 41. A low-level inverted clock signal is input from the inverter 37 to the transfer gate 43, and the transfer gate 43 sets its output to a high impedance state.

In response to a rising edge of the clock signal, the one-shot pulse generator 38 outputs a timing signal to the latch 41 through the OR gate 36. Upon receipt of the timing signal from the one-shot pulse generator 38, the latch 41 stores the data "C2" input from the transfer gate 42, and outputs the stored data "C2" to the output buffer 32. The output buffer 32 amplifies the data "C2" input from the latch 41, and outputs the amplified signal of the data "C2" to the output terminal D.

In cycle t6, upon receipt of a high-level inverted clock signal from the inverter 37, the transfer gate 43 outputs the data "D2" input from the input terminal Din to the latch 41. A low-level clock signal is input from the AND gate 34 to the transfer gate 42, and the transfer gate 42 sets its output to a high impedance state.

In response to a rising edge of the inverted clock signal from the inverter 35, the one-shot pulse generator 39 outputs a timing signal to the latch 41 through the OR gate 36. Upon receipt of the timing signal from the one-shot pulse generator 39, the latch 41 stores the data "D2" input from the transfer gate 43, and outputs the stored data "D2" to the output buffer 32. The output buffer 32 amplifies the input data "D2", and outputs the amplified signal of the data "D2" to the output terminal D.

In this manner, in the test mode, the output signal controller 30 performs time-division multiplexing on data input from the internal circuit with a multiplicity of 2 (X when each clock cycle is divided into X sections) in accordance with the clock signal, and outputs the time-division multiplexed data to the two (X when each clock cycle is divided into the X sections) output terminals C and D.

As describe above, in the test mode, it is possible for the output signal controller 30 to output data the same as those of the normal operation mode, which are input from the input terminals Cin and Din and are output to the two output terminals C and D, using the single output terminal D with the same number of clock cycles as those of the normal operation mode.

Next, FIG. 5 is a block diagram showing a part of the internal structure of a semiconductor integrated circuit 1 such as a DRAM in which the input signal controller 10 and the output signal controller 30 in accordance with the present embodiment are employed.

The semiconductor integrated circuit 1 is provided with: a clock input pad CLK; control input pads CTRL through which control signals for the semiconductor integrated circuit 1, such as a chip select signal, a row address strobe signal, a column address strobe signal, or a write enable signal, are input; address input pads ADR through which address signals are input; input/output pads DQ through which input/output data signals are input and output; an input signal control block 100; a command decoder 50 which decodes input command signals and supplies control signals to a memory cell array 70; an address decoder 60 which decodes the input address signals and supplies decoded column address signals and decoded row address signals to the memory cell array 70; the memory cell array 70; an input/output buffer 80; an operation mode setting circuit 90; an output signal control block 300; and an input signal control block 450.

The input signal control block 100 includes m input signal controllers 10C-1 to 10C-m and n input signal controllers 10A-1 to 10A-n, where m and n are integers greater than or equal to 1. The structures of the input signal controllers 10C-1 to 10C-m and the input signal controllers 10A-1 to 10A-n are the same as the structure of the input signal controller 10.

The input terminals A and B of each of the input signal controllers 10C-1 to 10C-m are connected to the control input pads CTRL of the semiconductor integrated circuit 1. Moreover, the output terminals Aout and Bout of each of the input signal controllers 10C-1 to 10C-m are connected to command input terminals of the command decoder 50.

The input terminals A and B of each of the input signal controllers 10A-1 to 10A-n are connected to the address input pads ADR of the semiconductor integrated circuit 1. Moreover, the output terminals Aout and Bout of each of the input signal controller 10A-1 to 10A-n are connected to address input terminals of the address decoder 60.

It is noted that the test mode input terminal TEST of each of the input signal controllers 10C-1 to 10C-m and 10A-1 to 10A-n is connected to the operation mode setting circuit 90, which outputs the mode signal, and the modes thereof are switched between the normal operation mode and the test mode. The operation mode setting circuit 90 can be implemented by an input pad dedicated to the test mode, to which the mode signal is supplied from the outside thereof. Alternatively, the operation mode setting circuit 90 can be implemented by controlling a fuse depending on whether the test mode is to be set or the normal operation mode is to be set (e.g., the fuse is not blown when the test mode is set so as to perform a manufacturing test, while the fuse is blown when the normal operation mode is set after the completion of the manufacturing test).

The output signal control block 300 includes p output signal controllers 30-1 to 30-p, where p is an integer greater than or equal to 1. The structures of the output signal controllers 30-1 to 30-p are the same as the structure of the output signal controller 30. The output terminals C and D of each of the output signal controllers 30-1 to 30-p are connected to the input/output pads DQ of the semiconductor integrated circuit 1. Moreover, the input terminals Cin and Din of each of the output signal controllers 30-1 to 30-p are connected to data output terminals of the input/output buffer 80.

The input signal control block 450 includes p input signal controllers 45-1 to 45-p. The structures of the input signal controllers 45-1 to 45-p are the same as the structure of the input signal controller 10.

It is noted that the test mode input terminal TEST of each of the output signal controllers 30-1 to 30-p and the input signal controllers 45-1 to 45-p is connected to, for example, the foregoing operation mode setting circuit 90, and the modes thereof are switched between the normal operation mode and the test mode.

Moreover, when the present embodiment is applied to output pads instead of the input/output pads, the input signal control block 450 is not provided.

The clock input pad CLK is connected to the input signal controllers 10C-1 to 10C-m and 10A-1 to 10A-n, the command decoder 50, the address decoder 60, the input/output buffer 80, the output signal controller 30-1 to 30-p, and the input signal controllers 45-1 to 45-p, thereby supplying a common clock signal thereto.

In this manner, in the semiconductor integrated circuit 1, the input signal control block 100 is provided between the input pads (signal input terminals) and the internal circuit (the command decoder 50, the address decoder 60, and the memory cell array 70). Moreover, each clock cycle is divided into two sections, and time-division multiplexing is applied to signals input to the input pads (input terminals) of the semiconductor integrated circuit 1. As a result, when the input signal control block 100 is set to the test mode and a manufacturing test of the semiconductor integrated circuit 1 is performed, it is possible to halve the number of address input pads which are required for inputting address signals and the number of control input pads which are required for inputting control signals.

In the same manner as the input signal control block 100 provided between the input pads and the internal circuit of the semiconductor integrated circuit 1, the output signal control block 300 is provided between the output pads (signal output terminals) and the internal circuit (the input/output buffer 80) of the semiconductor integrated circuit 1. As a result, in the test mode, it is possible to halve the number of outputs pads for outputting data signals.

When the semiconductor integrated circuit 1 is set to the test mode, address signals input from the address input pads ADR, command signals input from the control input pads CTRL, and data output signals output from the input/output pads DQ change with a period half (one-Xth when each clock cycle is divided into X sections) the period with which those signals change in the normal operation mode. However, in the test mode, signals output from the input signal controller 10 to the internal circuit and signals input from the internal circuit to the output signal controller 30 change so as to have the same period as in the normal operation mode. Therefore, it is possible to employ the input signal controller 10 and the output signal controller 30 without modifying the design of the internal circuit. Therefore, in the test mode, it is not necessary to operate the internal circuit of the semiconductor integrated circuit 1 at a clock frequency higher than that of the normal operation mode. As a result, the clock frequency that restricts the design of the semiconductor integrated circuit 1 can be set to the same value as that of the normal operation mode. Therefore, restrictions on the design are mitigated, and the development costs and the development time can be reduced.

Moreover, the input signal controller 10 generates timing signals which are used for storing input signals, based on the input clock. The output signal controller 30 generates timing signals which are used for storing signals to be output, based on the input clock. Therefore, the period of the clock signal input from the clock input pad CLK can be set to the same value as that of the normal operation mode.

Next, FIGS. 6A, 6B, 7A, and 7B are schematic diagrams showing comparisons between the related art and the present embodiment with respect to the mode of connection between a test system (a tester) and a plurality of semiconductor integrated circuits (chips that are not yet packaged).

In the illustrated test system, the number of output terminals N through which signals are supplied to test subjects is 120, and the number of input/output terminals M through which signals are input to and output from the test subjects is 40. Moreover, as for the test subjects, in semiconductor integrated circuits 9-1 to 9-10 in accordance with the related art, the number of input terminals (input pads) A is 12, and the number of input/output terminals (input/output pads) B is 4. In semiconductor integrated circuits 1-1 to 1-20 in accordance with the present embodiment, the number of input terminals A is 6, and the number of input/output terminals B is 2. Moreover, the semiconductor integrated circuits 1-1 to 1-20 each includes the above-described input signal controllers 10 and the output signal controllers 30.

As shown in FIG. 6A, due to the restrictions on the number of input terminals and the number of input/output terminals of the test system (i.e., N=120 and M=4), when semiconductor integrated circuits having the illustrated structures are test subjects, the related art tests ten (i.e., N/A=10 and M/B=10) semiconductor integrated circuits 9-1 to 9-10 simultaneously.

Figure 6B:
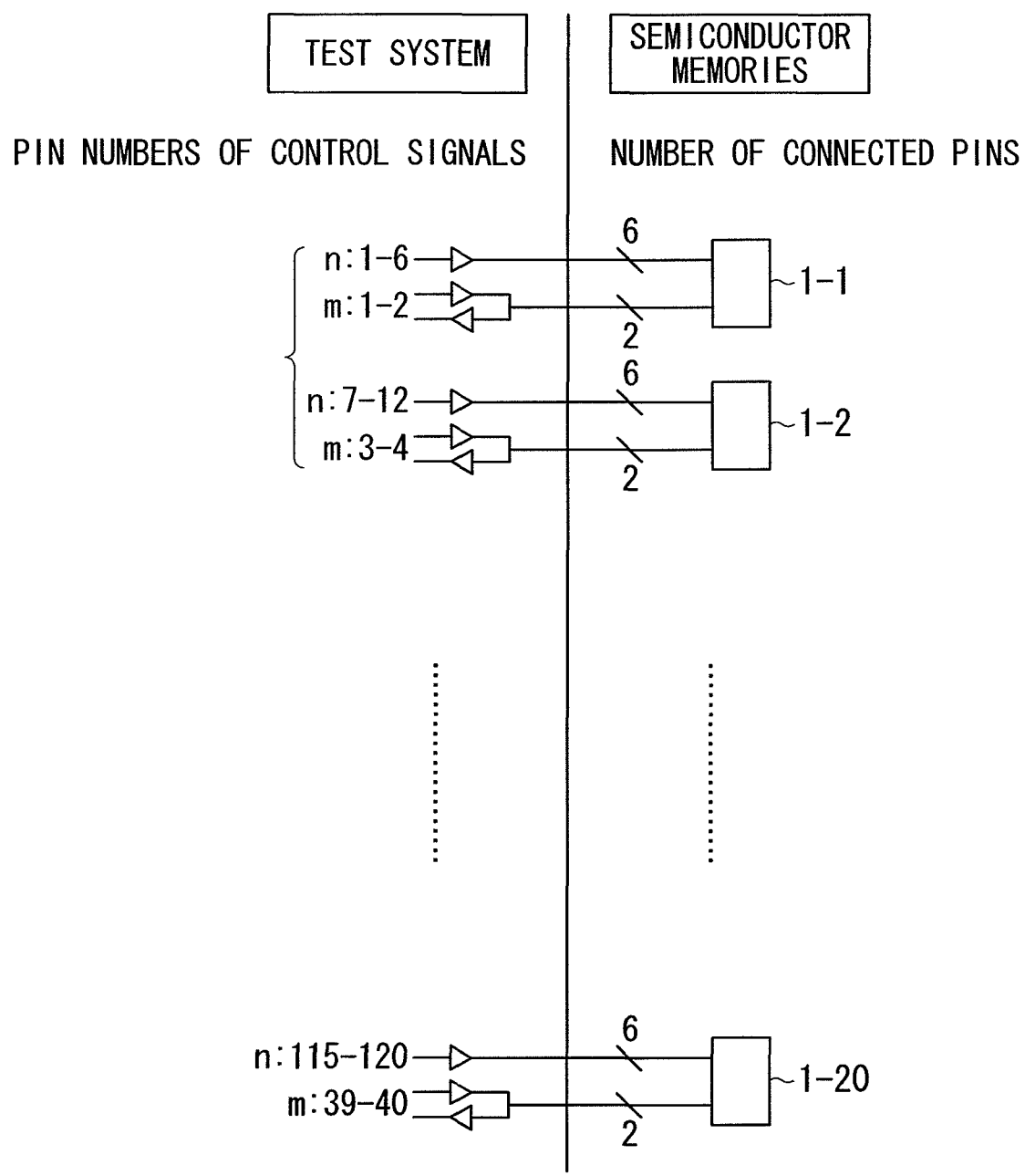
FIG. 6B is a diagram showing the relationship between pins of a test system and those of semiconductor memories in a manufacturing test (measurement) of the semiconductor integrated circuit in accordance with the first embodiment.

In contrast, as shown in FIG. 6B, the present embodiment inputs and outputs two pieces of data per clock cycle by employing the input signal controllers 10 and the output signal controllers 30, so that it is possible to test twenty (i.e., N/(A/2)=20 and M/(B/2)=20) semiconductor integrated circuits 1-1 to 1-20 simultaneously.

In the manufacturing test of a semiconductor integrated circuit such as a DRAM in accordance with the related art, one piece of data is input and output per clock cycle through one input/output terminal of the semiconductor integrated circuit. In contrast, in the test mode, the present embodiment employs the input signal controllers 10 and the output signal controllers 30 which are respectively capable of inputting and outputting data per clock cycle through one input/output terminal, by performing time-division demultiplexing and time-division multiplexing. As a result, it is possible to input and output a plurality of pieces of data through one input/output terminal.

Generalizing the foregoing discussion, when a test system having N input signal terminals and M input/output signal terminals tests (measures) semiconductor integrated circuits each having A address/command input terminals and B input/output terminals, the number of semiconductor integrated circuits that can be tested simultaneously is limited by the number of the input signal terminals or the number of the input/output terminals. Specifically, in this test system, the number of semiconductor integrated circuits that can be tested simultaneously is no greater than either (N/A) or (M/B), i.e., the smaller one of (N/A) and (M/B).

Since the present embodiment divides each clock cycle into X sections (in this case X=2), the number of simultaneously testable semiconductor integrated circuits, which is restricted by the number of input signal terminals, can be increased to N/(A/2), and the number of simultaneously testable semiconductor integrated circuits, which is restricted by the number of input/output signal terminals, can be increased to M/(B/2). Therefore, it is possible to increase the number of semiconductor integrated circuits that can be simultaneously tested (measured) in a manufacturing test X times (in this case X=2).

It is noted that in the present embodiment, the multiplicity of time-division demultiplexing and time-division multiplexing in the input signal controller 10 and the output signal controller 30 is set to 2 (X=2). However, the multiplicity X of time-division demultiplexing and time-division multiplexing can be set to 3 or greater. Moreover, M, N, A, and B are integers greater than or equal to 1, and X is an integer greater than or equal to 2. Furthermore, in the foregoing calculations using M, N, A, and B, the fractional portions of calculation results are dropped.

Figure 7B:
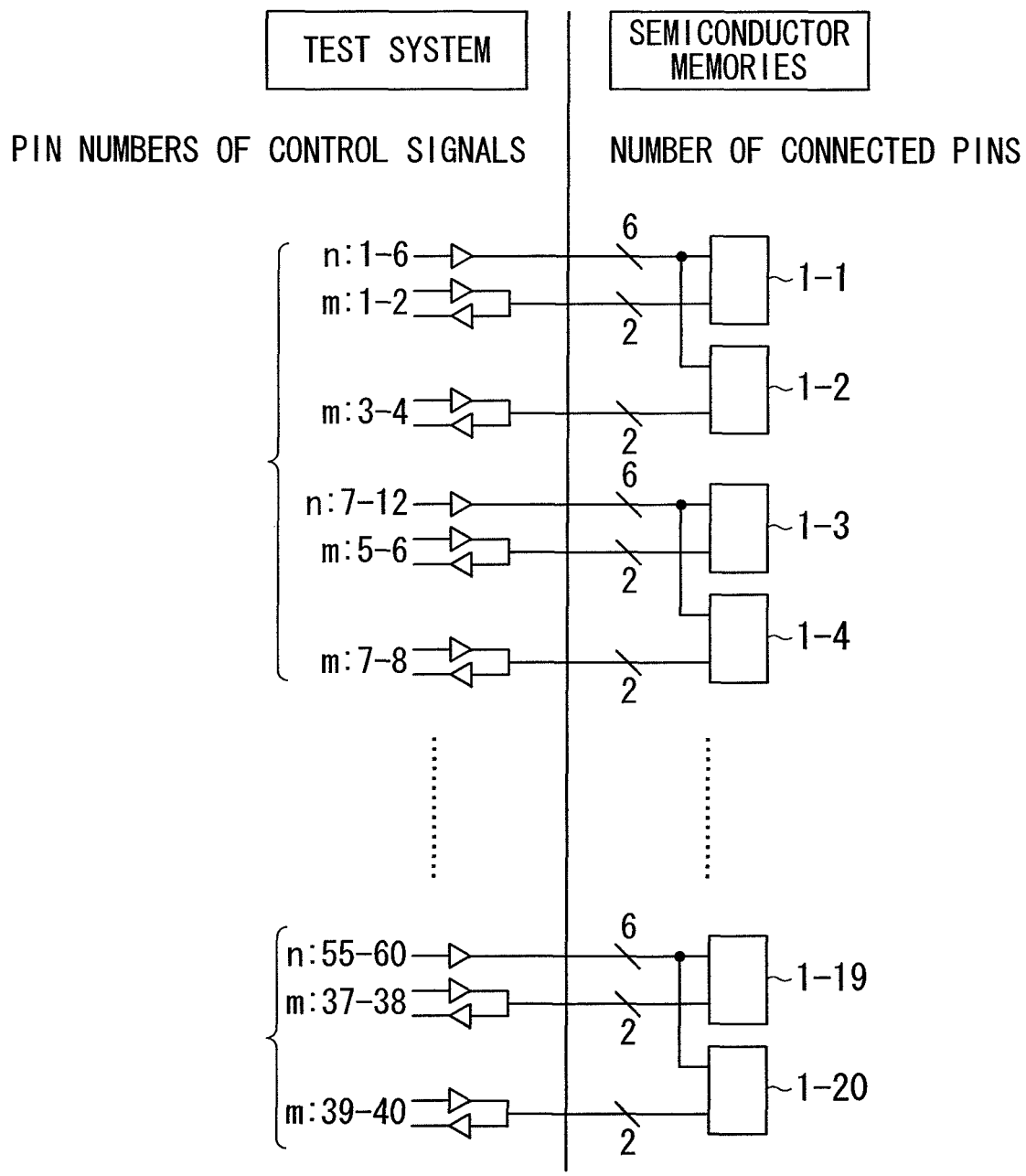
FIG. 7B is a diagram showing the relationship between pins of a test system and those of semiconductor memories in a manufacturing test (measurement) of the semiconductor integrated circuit in accordance with the first embodiment.

Next, FIG. 7A shows an exemplary configuration in accordance with the related art that employs a common connection by which Y (in this case Y=2) semiconductor integrated circuits use common input terminals. Moreover, FIG. 7B shows an exemplary configuration in accordance with the present embodiment that employs common connection by which two (Y=2) semiconductor integrated circuits use common input terminals. In accordance with these exemplary configurations, it is possible to perform a manufacturing test using half (1/Y) the number of input signal terminals as compared to those in FIG. 6A and FIG. 6B.

While a manufacturing test using the common connection configuration shown in FIG. 6B requires 120 input signal terminals, the number of input signal terminals used in a manufacturing test using the common connection configuration shown in FIG. 7B can be reduced to 60.

As described above, by performing time-division demultiplexing and time-division multiplexing of data which are input and output through one terminal, it is possible to increase the number of semiconductor integrated circuits that can be measured simultaneously without increasing the number of terminals used in a manufacturing test. When the multiplicity of time-division demultiplexing and time-division multiplexing is X, where X is an integer greater than or equal to 2, the number of semiconductor integrated circuits that can be measured simultaneously can be increased X times, thereby making it possible to reduce the test costs.

Moreover, there is a problem in that when testing semiconductor integrated circuits (semiconductor chips) provided in a semiconductor wafer, since the semiconductor chips are densely integrated, the density of terminals of the test system which are connected to the semiconductor chips approaches a physical limit. The related art deals with such a problem by reducing the number of semiconductor integrated circuits that are tested simultaneously. In contrast, since the present embodiment can reduce the number of input terminals and the number of output terminals used in measurement, it is possible to execute tests without reducing the number of semiconductor integrated circuits that are tested simultaneously.

As a result, the test time can be reduced significantly, and the test costs can also be reduced.

It is noted that in the present invention, an internal circuit corresponds to the command decoder 50, the address decoder 60, the memory cell array 70, and the input/output buffer 80.

In the present invention, a first input terminal corresponds to the input terminal A, a second input terminal corresponds to the input terminal B, a third input terminal corresponds to the input terminal Cin, and a fourth input terminal corresponds to the input terminal Din.

In the present invention, a first output terminal corresponds to the output terminal Aout, a second output terminal corresponds to the output terminal Bout, a third output terminal corresponds to the output terminal C, and a fourth output terminal corresponds to the output terminal D.

In the present invention, a first one-shot pulse generator corresponds to the one-shot pulse generator 17, a second one-shot pulse generator corresponds to the one-shot pulse generator 16, a third one-shot pulse generator corresponds to the one-shot pulse generator 38, and a fourth one-shot pulse generator corresponds to the one-shot pulse generator 39.

In the present invention, a first transfer gate corresponds to the transfer gate 18, a second transfer gate corresponds to the transfer gate 19, a third transfer gate corresponds to the transfer gate 20, a fourth transfer gate corresponds to the transfer gate 21, a fifth transfer gate corresponds to the transfer gate 42, and a sixth transfer gate corresponds to the transfer gate 43.

In the present invention, a first inverter corresponds to the inverter 14, a second inverter corresponds to the inverter 15, a third inverter corresponds to the inverter 35, and a fourth inverter corresponds to the inverter 37.

In the present invention, a first latch corresponds to the latch 22, a second latch corresponds to the latch 23, a third latch corresponds to the latch 40, and a fourth latch corresponds to the latch 41.

In the present invention, signal input terminals correspond to the control input pads CTRL and the address input pads ADR.

In the present invention, a clock signal input terminal, a first clock input terminal, and a second clock input terminal correspond to the clock input terminal CLK, and a first test mode input terminal and a second test mode input terminal correspond to the test mode input terminal TEST.

In the present invention, signal output terminals correspond to the input/output pads DQ.

In the present invention, first data corresponds to data "A1" and data "A2", second data corresponds to data "B1" and data "B2", third data corresponds to data "C1" and data "C2", and fourth data corresponds to data "D1" and data "D2".

It is apparent that the present invention is not limited to the above embodiments, but may be modified and changed without departing from the scope and spirit of the invention.

What is claimed is:

1. A semiconductor integrated circuit comprising:
   A signal input terminals which include control input pads, A being an integer greater than or equal to 2;
   an internal circuit;
   a clock signal input terminal to which a clock signal is input; and
   an input signal control block which, in a test mode, separates time-division multiplexed data having a multiplicity of X, the time-division multiplexed data being input from Y signal input terminals among the A signal input terminals, into individual data in accordance with the clock signal, and outputs the separated individual data to the internal circuit, X being an integer greater than or equal to 2,
   wherein, if A/X results in an integer, then Y equals A/X; and wherein, if A/X results in a non-integer, then Y equals A/X rounded up to a closest higher integer, wherein in a normal operation mode, the input signal control block outputs data input from the A signal input terminals to the internal circuit.

2. The semiconductor integrated circuit as recited in claim 1, wherein the time-division multiplexed data changes so as to have one-Xth of a period of the data input from the A signal input terminals in the normal operation mode.

3. The semiconductor integrated circuit as recited in claim 1, wherein in the test mode, the input signal control block outputs the separated individual data to the internal circuit so as to have a period which is equal to a period of the data output to the internal circuit in the normal operation mode.

4. A semiconductor integrated circuit comprising:

A signal input terminals which include control input pads, A being an integer greater than or equal to 2;

an internal circuit;

a clock signal input terminal to which a clock signal is input; and an input signal control block which, in a test mode, separates time-division multiplexed data having a multiplicity of X, the time-division multiplexed data being input from Y signal input terminals among the A signal input terminals, into individual data in accordance with the clock signal, and outputs the separated individual data to the internal circuit, X being an integer greater than or equal to 2, wherein, if A/X results in an integer, then Y equals A/X; and wherein, if A/X results in a non-integer, then Y equals A/X rounded up to a closest higher integer, wherein the input signal control block comprises one or more input signal controllers, each of the input signal controllers is connected to X signal input terminals among the A signal input terminals, and in the test mode, each of the input signal controllers separates the time-division multiplexed data input from one signal input terminal among the X signal input terminal into X pieces of data in accordance with the clock signal, and outputs the separated X pieces of data to the internal circuit.

5. The semiconductor integrated circuit as recited in claim 4, wherein in a normal operation mode, each of the input signal controllers outputs data input from the X signal input terminals to the internal circuit.

6. The semiconductor integrated circuit as recited in claim 5, wherein the multiplicity X is 2, and the X signal input terminals are two signal input terminals.

7. The semiconductor integrated circuit as recited in claim 6, wherein each of the input signal controllers is provided with:

a first input terminal to which first data is input from a first signal input terminal among the two signal input terminals;

a second input terminal to which second data is input from a second signal input terminal among the two signal input terminal;

a first clock input terminal connected to the clock signal input terminal and to which the clock signal is input;

a first test mode input terminal to which a mode signal for switching between the normal operation mode and the test mode is input;

an input tri-state buffer which outputs the first data input from the first input terminal or sets an output of the input tri-state buffer to a high impedance state depending on the mode signal;

a first one-shot pulse generator which generates a first one-shot pulse signal in response to a rising edge of the clock signal;

a first inverter which inverts the clock signal and outputs an inverted clock signal;

a second one-shot pulse generator which generates a second one-shot pulse signal in response to a rising edge of the inverted clock signal;

a second inverter which inverts the mode signal and outputs an inverted mode signal;

a first transfer gate which determines whether or not to output data input from the input tri-state buffer, based on the inverted mode signal;

a second transfer gate which determines whether or not to output the second data, based on the mode signal;

a third transfer gate which determines whether or not to output the first one-shot pulse signal, based on the inverted mode signal;

a fourth transfer gate which determines whether or not to output the second one-shot pulse signal, based on the mode signal;

a first latch which stores the first data input from the first transfer gate or the second data input from the second transfer gate in accordance with the first one-shot pulse signal input from the third transfer gate or the second one-shot pulse signal input from the fourth transfer gate;

a second latch which stores the second data in accordance with the first one-shot pulse signal;

a first output terminal to which data is supplied from the first latch; and a second output terminal to which data is supplied from the second latch.

8. A semiconductor integrated circuit comprising:

A signal input terminals which include control input pads, A being an integer greater than or equal to 2;

an internal circuit;

a clock signal input terminal to which a clock signal is input; and an input signal control block which, in a test mode, separates time-division multiplexed data having a multiplicity of X, the time-division multiplexed data being input from Y signal input terminals among the A signal input terminals, into individual data in accordance with the clock signal, and outputs the separated individual data to the internal circuit, X being an integer greater than or equal to 2, wherein, if A/X results in an integer, then Y equals A/X; and wherein, if A/X results in a non-integer, then Y equals A/X rounded up to a closest higher integer, wherein the semiconductor integrated circuit further comprises:

B signal output terminals; and an output signal control block which, in the test mode, performs time-division multiplexing of data input from the internal circuit with a multiplicity of X in accordance with the clock signal input from the clock signal input terminal, and outputs time-division multiplexed data through Z signal output terminals among the B signal output terminals, wherein, if B/X results in an integer, then Z equals B/X; and wherein, if B/X results in a non-integer, then Z equals B/X rounded up to a closest higher integer.

9. The semiconductor integrated circuit as recited in claim 8, wherein in a normal operation mode, the output signal control block outputs the data input from the internal circuit to the B signal output terminals.

10. The semiconductor integrated circuit as recited in claim 9, wherein a period of the data input from the internal circuit in the test mode is equal to a period of the data input from the internal circuit in the normal operation mode.

11. The semiconductor integrated circuit as recited in claim 9, wherein the time-division multiplexed data output through the B/X signal output terminals changes so as to have one-Xth of a period of the data output through the B signal output terminals in the normal operation mode.

12. The semiconductor integrated circuit as recited in claim 8, wherein the output signal control block comprises one or more output signal controllers,
   each of the output signal controllers is connected to X signal output terminals among the B signal output terminals, and
   in the test mode, each of the output signal controllers performs time-division multiplexing of X pieces of data input from the internal circuit in accordance with the clock signal to generate time-division multiplexed data, and outputs the time-division multiplexed data to one signal output terminal among the X signal output terminals.

13. The semiconductor integrated circuit as recited in claim 12, wherein in a normal operation mode, each of the output signal controllers outputs the X pieces of data input from the internal circuit to the X signal output terminals.

14. The semiconductor integrated circuit as recited in claim 13, wherein the multiplicity X is 2, and the X signal output terminals are two signal output terminals.

15. The semiconductor integrated circuit as recited in claim 14, wherein
   each of the output signal controllers is provided with:
   a third input terminal to which third data is input from the internal circuit;
   a fourth input terminal to which fourth data is input from the internal circuit;
   a second clock input terminal connected to the clock signal input terminal and to which the clock signal is input;
   a second test mode input terminal to which a mode signal for switching between the normal operation mode and the test mode is input;
   an AND gate which calculates a logical product of the clock signal and the mode signal, and outputs a calculated result;
   a third inverter which inverts the calculated result from the AND gate;
   a fourth inverter which inverts the calculated result from the AND gate;
   a fifth transfer gate which determines whether or not to output the third data, based on the calculated result from the AND gate;
   a sixth transfer gate which determines whether or not to output the fourth data, based on a signal output from the fourth inverter;
   a third one-shot pulse generator which generates a third one-shot pulse signal in response to a rising edge of the clock signal;
   a fourth one-shot pulse generator which generates a fourth one-shot pulse signal in response to a rising edge of a signal output from the third inverter;
   an OR gate which calculates a logical sum of the third one-shot pulse signal and the fourth one-shot pulse signal to generate a calculated result;
   a third latch which stores the third data input from the third input terminal in accordance with the third one-shot pulse signal;
   a fourth latch which stores the third data output from the fifth transfer gate or the fourth data output from the sixth transfer gate in accordance with the calculated result from the OR gate;
   a third output terminal connected to a first signal output terminal among the two signal output terminals and to which an output signal of the third latch is supplied; and
   a fourth output terminal connected to a second signal output terminal among the two signal output terminals and to which an output signal of the fourth latch is supplied.

16. A semiconductor integrated circuit comprising:
   A signal input terminals which include control input pads, A being an integer greater than or equal to 2;
   an internal circuit;
   a clock signal input terminal to which a clock signal is input; and
   an input signal control block which, in a test mode, separates time-division multiplexed data having a multiplicity of X, the time-division multiplexed data being input from Y signal input terminals among the A signal input terminals, into individual data in accordance with the clock signal, and outputs the separated individual data to the internal circuit, X being an integer greater than or equal to 2,
   wherein, if A/X results in an integer, then Y equals A/X; and
   wherein, if A/X results in a non-integer, then Y equals A/X rounded up to a closest higher integer,
   wherein the semiconductor integrated circuit further comprises a mode setting circuit which outputs a mode signal for switching between a normal operation mode and the test mode.

17. A semiconductor integrated circuit comprising:
   A signal input means including a plurality of control signal input means, A being an integer greater than or equal to 2;
   a clock signal input means for inputting a clock signal; and
   a means for, in a test mode, separating time-division multiplexed data having a multiplicity of X, the time-division multiplexed data being input from Y signal input means among the A signal input means, into individual data in accordance with the clock signal, and outputting the separated individual data to an internal circuit of the semiconductor integrated circuit, X being an integer greater than or equal to 2,
   wherein, if A/X results in an integer, then Y equals A/X; and
   wherein, if A/X results in a non-integer, then Y equals A/X rounded up to a closest higher integer.

* * * * *

UNITED STATES PATENT AND TRADEMARK OFFICE
CERTIFICATE OF CORRECTION

| | | |
|---|---|---|
| PATENT NO. | : 7,948,912 B2 | Page 1 of 1 |
| APPLICATION NO. | : 12/255300 | |
| DATED | : May 24, 2011 | |
| INVENTOR(S) | : Kohei Nakamura | |

It is certified that error appears in the above-identified patent and that said Letters Patent is hereby corrected as shown below:

In the Specification

Column 7, Line 6: after "22" delete "20"

Column 7, Line 15: after "transfer" delete "25"

Column 14, Line 39: delete "M=4)," and insert -- M=40), --

Signed and Sealed this
Seventeenth Day of June, 2014

Michelle K. Lee
*Deputy Director of the United States Patent and Trademark Office*